(12) United States Patent
Bula et al.

(10) Patent No.: US 6,268,908 B1
(45) Date of Patent: Jul. 31, 2001

(54) MICRO ADJUSTABLE ILLUMINATION APERTURE

(75) Inventors: Orest Bula, Shelburne; Daniel C. Cole, Jericho; Edward W. Conrad, Jeffersonville; David Vaclay Horak, Essex Junction; Jed Hickory Rankin, Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/385,907

(22) Filed: Aug. 30, 1999

(51) Int. Cl.[7] .......................... G03B 27/72; G02B 26/02; C23C 14/00
(52) U.S. Cl. ........................ 355/71; 359/230; 204/298.11
(58) Field of Search ................. 355/46, 67, 71, 355/77; 359/227, 230, 234; 204/298.11

(56) References Cited

U.S. PATENT DOCUMENTS

| | | | |
|---|---|---|---|
| 4,584,056 | * 4/1986 | Perret et al. | 216/13 |
| 4,589,769 | 5/1986 | Matsuki | 355/71 |
| 4,851,882 | 7/1989 | Takahashi et al. | 355/46 |
| 5,473,410 | 12/1995 | Nishi | 355/53 |
| 5,552,925 | * 9/1996 | Worley | 359/230 |
| 5,587,832 | * 12/1996 | Krause | 359/385 |
| 5,610,625 | 3/1997 | Sampsell | 345/84 |
| 5,633,755 | 5/1997 | Manabe et al. | 359/443 |
| 5,638,211 | 6/1997 | Shiraishi | 359/559 |
| 5,673,102 | 9/1997 | Suzuki et al. | 355/53 |
| 5,707,501 | * 1/1998 | Inoue et al. | 204/298.11 |
| 5,726,739 | 3/1998 | Hayata | 355/67 |
| 5,781,331 | * 7/1998 | Carr et al. | 359/288 |
| 5,784,190 | * 7/1998 | Worley | 359/291 |
| 5,796,152 | * 8/1998 | Carr et al. | 257/415 |
| 5,796,508 | 8/1998 | Suzuki | 359/224 |
| 5,828,485 | 10/1998 | Hewlett | 359/291 |
| 5,870,176 | 2/1999 | Sweatt et al. | 355/53 |
| 5,923,466 | * 7/1999 | Krause et al. | 359/389 |

OTHER PUBLICATIONS

E. Barouch, S. Knodli, M.S. Young, "Illuminator Optimization for Projection Printing," Proc. SPIE 3679, edited by Luc Vanden Hove, 1999.

N. Shiraishi, S. Hirukawa, et al., "New Imaging for 64M DRAM," pro. SPIE 1674, pp. 741–752, edited by J.D. Cuthbert, 1992.

* cited by examiner

*Primary Examiner*—Russell Adams
*Assistant Examiner*—Rodney Fuller
(74) *Attorney, Agent, or Firm*—Robert Walsh, Esq.; Kevin P. Radigan, Esq.; Heslin & Rothenberg, P.C.

(57) ABSTRACT

The distribution of ultraviolet light irradiated from an illumination source to optical elements of a projection exposure device is varied by an illumination aperture. The illumination aperture is formed with a plurality of openings which may be opened or closed independently to the passage of irradiating light. The size and shape of the opening formed by the plurality of openings of the illumination aperture is determined according to the particular image to be projected.

15 Claims, 7 Drawing Sheets fig. 1 fig. 2 fig. 3 fig. 4 fig. 5 fig. 6 fig. 7 fig. 8 fig. 9 fig. 10a    fig. 10b    fig. 10c fig. 11a    fig. 11b    fig. 11c fig. 12a    fig. 12b    fig. 12c fig. 13a    fig. 13b    fig. 13c fig. 14a     fig. 14b     fig. 14c fig. 15a     fig. 15b     fig. 15c fig. 16a     fig. 16b     fig. 16c fig. 17a     fig. 17b fig. 18 fig. 19

MICRO ADJUSTABLE ILLUMINATION APERTURE

TECHNICAL FIELD

This invention relates, in general, to the manufacture of integrated circuits and the like. More particularly, this invention relates to an illumination aperture or stop plate used to vary a distribution of light in a lithographic projection exposure device during the manufacture of integrated circuits.

BACKGROUND ART

Integrated circuits are commonly manufactured through utilization of photolithographic projection exposure devices (e.g., step reduction or step and repeat reduction exposure devices and scanning reduction projection exposure devices). One example of such a photolithographic projection exposure device is a device entitled Micrascan which is offered by Silicon Valley Group of San Jose, Calif. With these types of exposure devices, a substrate or wafer having a photosensitive resist layer formed on one of its surfaces is exposed to ultraviolet light irradiated from an illumination source which may be, for instance, a mercury lamp. In this process, light irradiated from the illumination source is first passed through a photomask or mask of the exposure device and then onto the photosensitive resist layer of the substrate. A circuit pattern which is to be transferred onto the substrate is formed on the mask and by irradiating light through the particular pattern formed on the mask, the circuit pattern may be projected or transferred onto the substrate for use in creating the integrated circuit.

Needless to say, the capacity of an integrated circuit may be increased by transferring finer or higher density circuit patterns onto the underlying substrates. To transfer these higher density circuit patterns, projection exposure devices have been implemented which reduce the size of the patterns projected from the mask onto the substrate. However, by reducing the size of the pattern to be transferred, due to the diffraction effects of light and consequent reduction in resolution, the pattern detrimentally becomes distorted and, in some cases, results in the transfer of an inaccurate circuit or a circuit which is not true with respect to the original circuit pattern.

Thus, a need exists for a device which transfers or projects a reduced circuit pattern or image from a mask onto an underlying substrate with a minimal loss of resolution and minimal reduction of fidelity.

SUMMARY OF THE INVENTION

The shortcomings of the prior art are overcome and additional advantages are provided through the provision of an illumination aperture in a projection exposure device. More particularly, the illumination aperture is positioned between an illumination source and a set of optical elements so that light irradiated from the illumination source must first pass through the illumination aperture before reaching the optical elements. To reach the optical elements, light from the illumination source passes through the illumination aperture through an opening having a given size, shape, and transmissivity. The particular size, shape, and transmissivity of the opening alters the distribution of onto the optical elements. The illumination aperture is used to alter the distribution of light that subsequently passes through the mask because it has been discovered that certain illumination aperture openings can markedly improve the printability of certain circuit patterns. For instance, the annular openings shown in FIGS. 11a–13c increase the fidelity of the transfer of many types of tightly packed, or nested, circuit patterns. Likewise, a square shaped opening (not shown) increases the fidelity of a pattern consisting of horizontal and vertical lines. Thus in accordance with the principles of the present invention, the fidelity of a circuit pattern is maintained and an accurate pattern is transferred by varying the size and shape of the illumination aperture opening according to the type of pattern to be transferred.

As has been discussed in a number of published articles (see, for example, E. Barouch, S. Knodli, M. S. Young, "Illuminator Optimization for Projection Printing," Proc. SPIE 3679, edited by Luc Vanden Hove, 1999; N. Shiraishi, S. Hirukawa, et al., "New Imaging for 64M DRAM," Proc. SPIE 1674, pp. 741–752, edited by J. D. Cuthbert, 1992), modified illuminator aperture openings can significantly change the printability of most patterns. However, the optimal aperture structure is closely tied to the type of patterns being imaged, thereby necessitating different aperture structures to achieve optimal printability for different mask patterns.

Additional shortcomings of the prior art are overcome and further advantages are provided through the provision of an illumination aperture having a variably sized and shaped opening. In particular, an illumination aperture is provided having a plurality of apertures which may be opened and closed to the passage of light, independently of one another, to form an opening having a desired size and shape according to the pattern intended to be transferred.

In one example of the present invention, an apparatus for forming variably sized and shaped openings is provided. The apparatus includes: a main body having formed therein a plurality of apertures; and a plurality of shutters associated with the apertures, each shutter having an open position and a closed position such that the open position allows light to pass through the associated aperture and the closed position prevents light from passing through the associated aperture; wherein the shutters may be opened and closed independently of one another.

Accordingly, the present invention advantageously allows an opening having a desired size and shape to be formed in a single illumination aperture. As a result, instead of requiring a particularly sized and shaped illumination aperture to be manually replaced with a differently sized and shaped illumination aperture each time a new circuit pattern is to be transferred, the plurality of apertures formed in the illumination aperture of the instant invention are opened and closed according to the particular circuit pattern to be transferred to form an opening having any desired shape and size. Consequently, the illumination aperture of the present invention facilitates the transfer of accurate and true circuit patterns from a mask onto a substrate and therefore effectively transfers fine and high density integrated circuit patterns.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which

FIGS. 10a–17b are top views of various illumination aperture embodiments in accordance with the present invention depicting a variety of opening arrangements;

BEST MODE FOR CARRYING OUT THE INVENTION

In accordance with the principles of the present invention, a projection exposure device is provided with an illumination aperture having a plurality of apertures which may be opened and closed independently of one another. The variable illuminator is tuned by experiment or simulation to improve printability. Printability is measured by how closely a printed structure conforms to what is desired. Another metric of printability is how closely a printed structure conforms to what is specified over a range of exposure or focus. One example of a projection exposure device having such an illumination aperture is described in detail b low with reference to FIG. 1.

Figure 1:
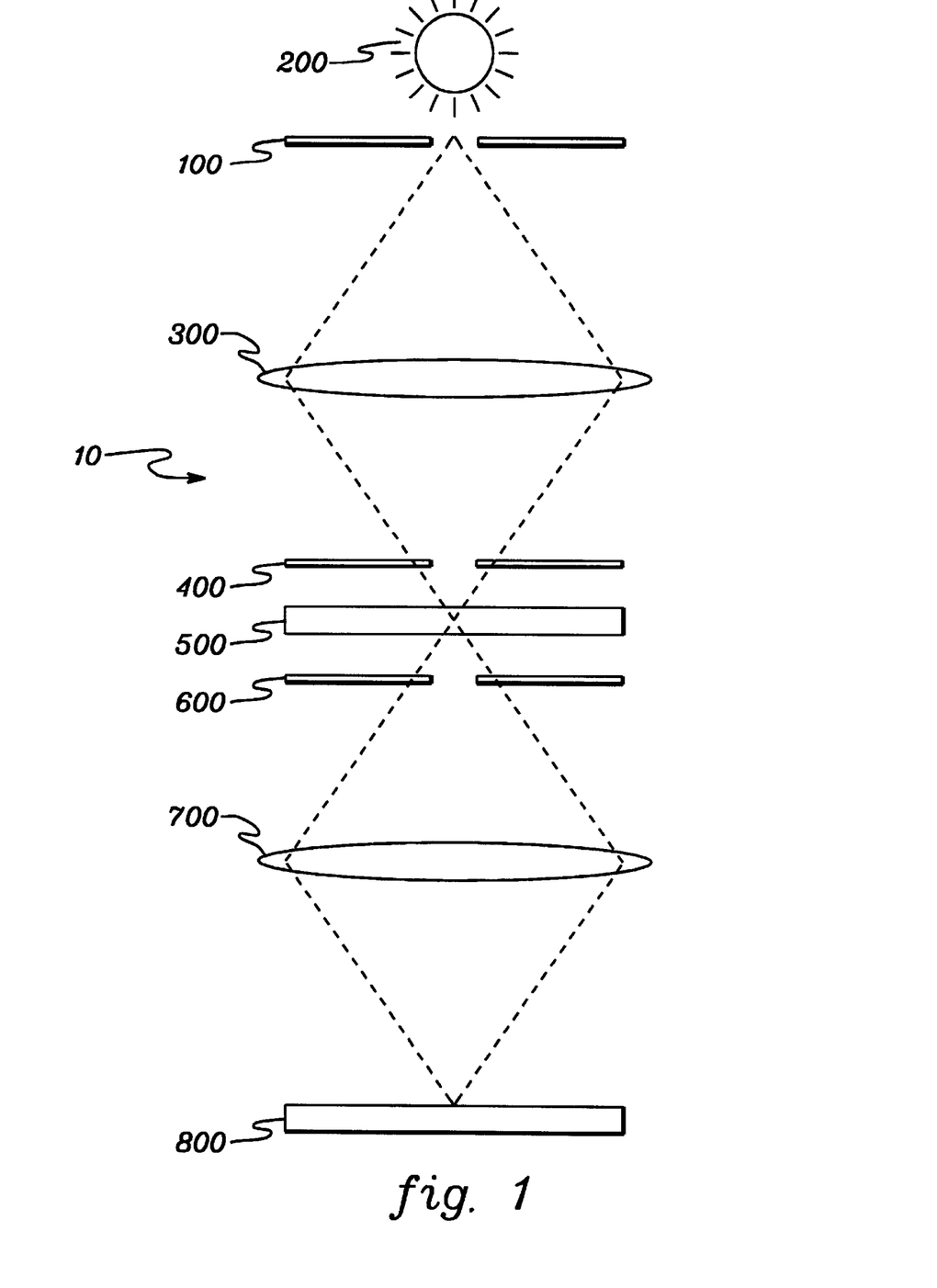
FIG. 1 is a schematic view of an example of a projection exposure device in which the present invention may be utilized.

Projection exposure device 10 typically includes, for example, an illumination source 200, an illumination aperture 100, a condenser lens unit 300, a pair of light blocking plates 400, 600, a photomask or mask 500, and an objective lens unit 700. A substrate or wafer 800 is positioned adjacent projection exposure device 10 so that an image or circuit pattern may be projected or transferred from projection exposure device 10 onto wafer 300. To this effect, Wafer 800 has a surface formed with a photosensitive resist layer, upon which the image is to be projected.

Operationally, ultraviolet light is initially irradiated from illumination source 200 through an opening formed in illumination aperture 100 to the optical elements located below. Some projection systems have additional optical components between 200 and 100 that help to distribute the incident light over the illumination aperture. As the ultraviolet light passes through the opening, its distribution is varied in a specified manner according to the size and shape of the opening. As previously discussed, the optimal size and shape of the opening for best printability of the mask pattern is dependent upon the particular circuit pattern to be transferred. Condenser lens unit 300, in turn, focuses the light passing through to mask 500 by directing the light in a direction perpendicular to mask 500 as it exits. In additions light blocking plates 400, 600 are positioned on both sides of mask 500 to limit the amount of light entering and leaving mask 900, respectively. As mentioned above, a circuit pattern or image to be projected onto substrate 800 is formed by passing light through the mask 900. The objective lens 700 images this light onto a plane at 800, where an image of reduced size from the mask is formed.

Figure 2:
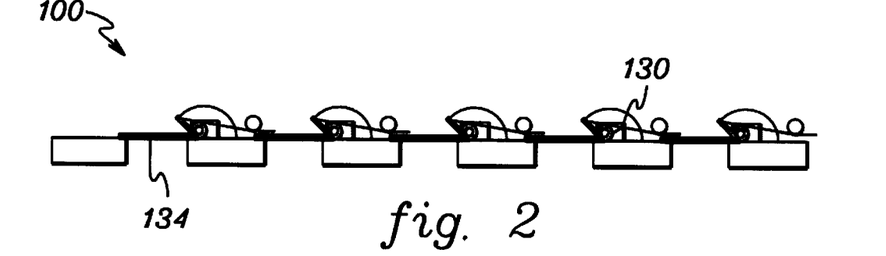
FIG. 2 is a side view of a first embodiment of an illumination aperture in accordance with the present invention.
Figure 3:
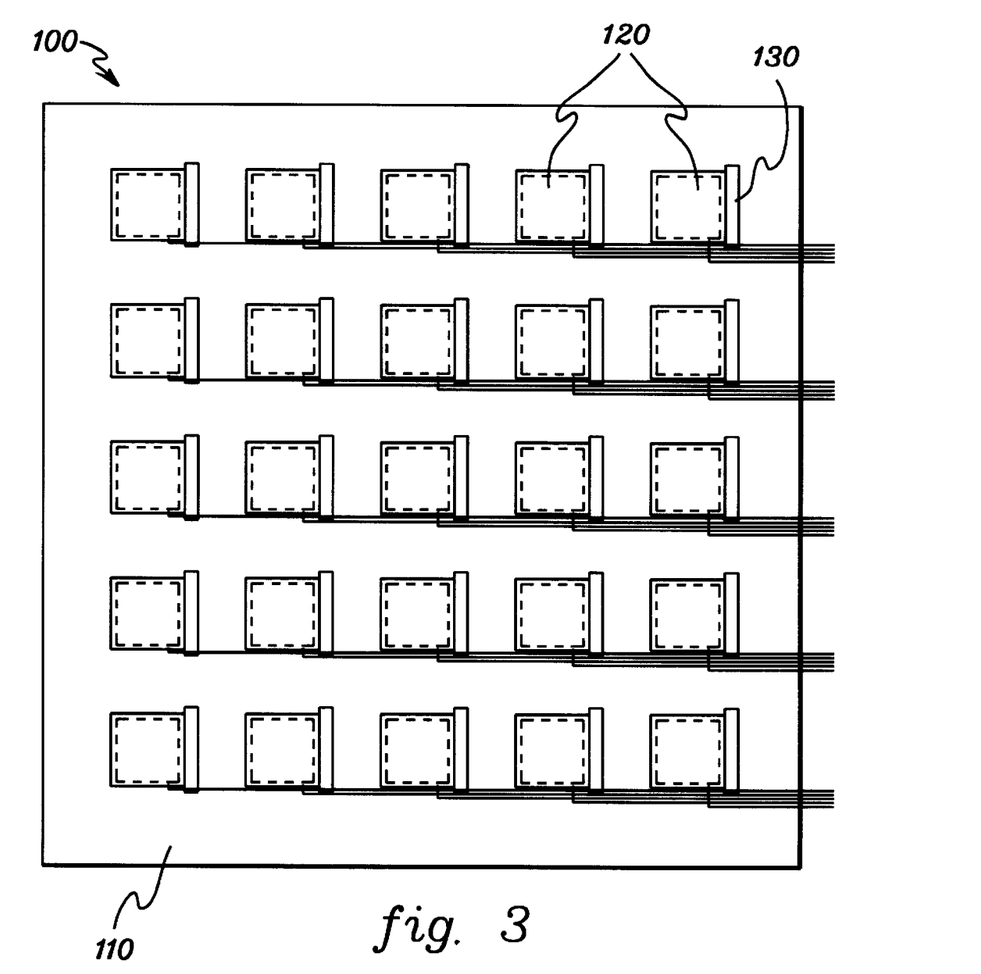
FIG. 3 is a top view of the illumination aperture of FIG. 2.

Turning now to FIGS. 2 and 3, in one embodiment illumination aperture 100 is shown to comprise a main body 110 which, in turn, has a plurality of openings formed therein. As best depicted in FIG. 3, the openings are arranged as an array, or in other words into rows and columns. In this particular embodiment, the array has five rows and five columns. In addition, openings 120 of this particular embodiment are aligned in a checkerboard fashion so that the edges defining opening 120 are co-linear with edges defining adjacent openings 120. Along a single edge of each opening 120 is positioned a hinge 130 which pivotally connects a shutter 134 to main body 110.

Figure 4:
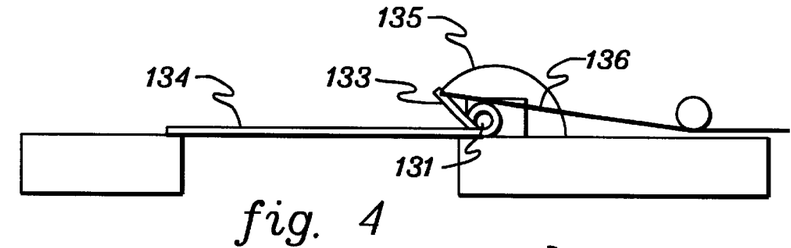
FIG. 4 is a partial side view of the illumination aperture of FIG. 2 showing a shutter in a closed position.
Figure 5:
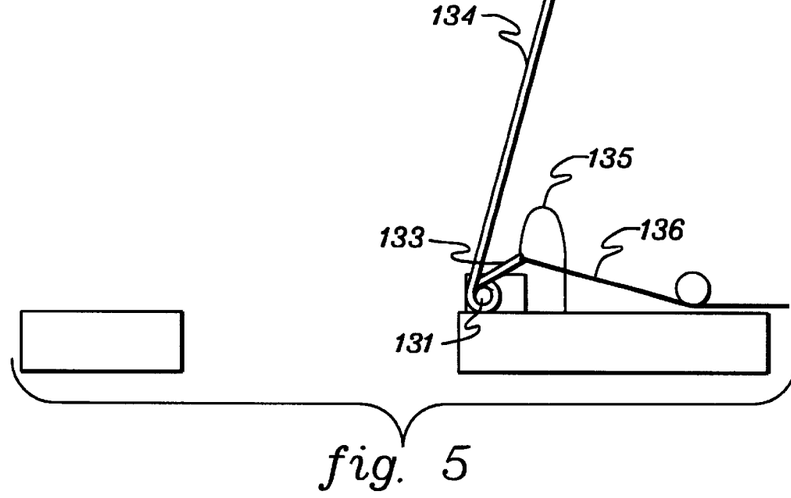
FIG. 5 is a partial side view of the illumination aperture of FIG. 2 showing a shutter in an open position.
Figure 6:
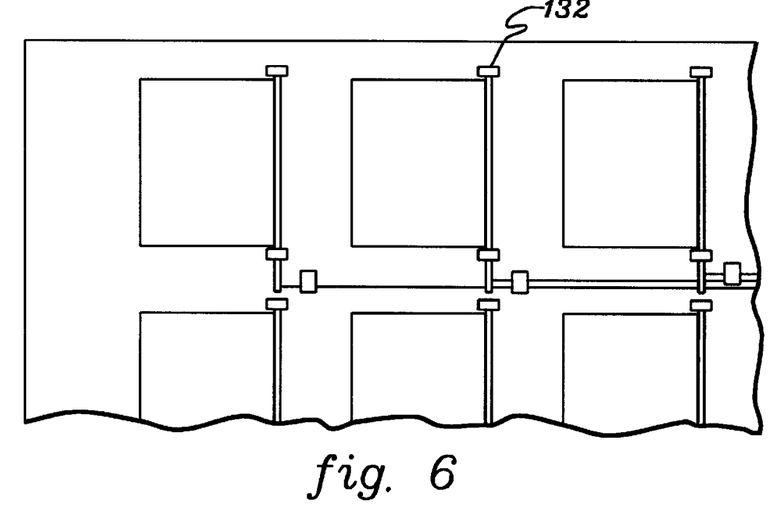
FIG. 6 is an enlarged top view of a portion of the illumination aperture of FIG. 2.

Referring now to FIGS. 4–6, hinges 130 are shown consisting of hinge shafts 131 and a plurality of hinge rings 132. Specifically, hinge rings 132 are mounted to main body 110 with hinge shaft 131 rotatably positioned therein. Furthermore, as mentioned above, shutters 134 are connected to hinges 130 so that they may pivot about hinge shafts 131 to open and close openings 120 to the passage of light. In addition to hinge shaft 131 and hinge rings 132, each hinge 130 also consists of an arm 133 extending away from hinge shaft 131. These arms 133 are connected at one end to hinge shafts 131 and at another end to springs 135 and actuators 136. Springs 135 and actuators 136 are, in this embodiment, used in conjunction to independently open and close openings 120 as described in greater detail below.

In addition to having one end connected to arm 133, as discussed above, each spring 135 is also connected at an opposite end to main body 110. In this manner springs 135 are arranged to apply a force against arms 133. As a result, the force applied by springs 135 rotates hinge shafts 131 and consequently pivots shutters 134 to close openings 120. On the other hand, as noted above, the ends of arms 133 connected to springs 135 are also fixed to actuators 136. As best seen in FIG. 6, actuators 136 extend away from arms 133 along a region of main body 110 between openings 120 to an automated controller (not shown). The controller, then, is operable to move each actuator to apply a force against arms 133 opposing the force generated by springs 133. When the force applied by actuators 136 exceeds the force generated by springs 133, arms 133 and shutters 134 move in direction to open openings 120. Further in this regard, it should also be noted that shutters 134 and the regions of main body 110 between openings 120 are sized such that they block a negligible amount of irradiating light, when openings 120 are open.

It should further be noted that the size and angle of the open shutters are engineered in such a way as to not block or shadow incident light. Small numerical apertures may be used for the condenser lens, thereby resulting in largely normal incident illumination situations. In the alternative, if small numerical apertures are not used, then more attention needs to be applied to adequately ensuring that the open shutters do not severely impact the transmitted light.

In accordance with one embodiment of the present invention, each shutter 134 is movable independently from other shutters 134. As a result, each opening 120 may also be opened and closed independently from other openings 120. To this end, the controller is arranged to move actuators 136 independently and may be utilized to open and close openings 120 to form a wide variety of opening sizes and shapes. For instance, FIGS. 10b, 11b, 12b, 13b, 14b, 15b, 16b and 17b depict several illumination aperture openings formed in a single embodiment of the invention having an array with fourteen rows and columns and correspond to the six distinct illumination apertures depicted in FIGS. 10a, 11a, 12a, 13a, 14a, 15a, 16a, and 17a. Thus, by allowing openings 120 to be opened and closed independently of other openings 120, the illumination aperture opening through which irradiated light is to pass may be adjusted according to the particular circuit pattern to be projected without having to physically replace the illumination aperture with other illumination apertures having distinct openings.

Figure 7:
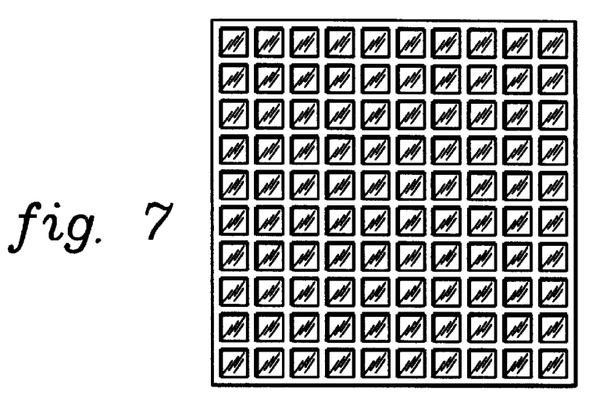
FIG. 7 is a top view of a second embodiment of an illumination aperture in accordance with the present invention.
Figure 8:
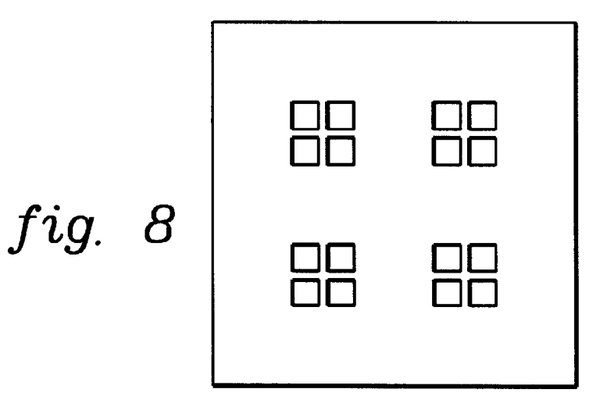
FIG. 8 is a top view of the illumination aperture of FIG. 7 having a four hole opening arrangement.
Figure 9:
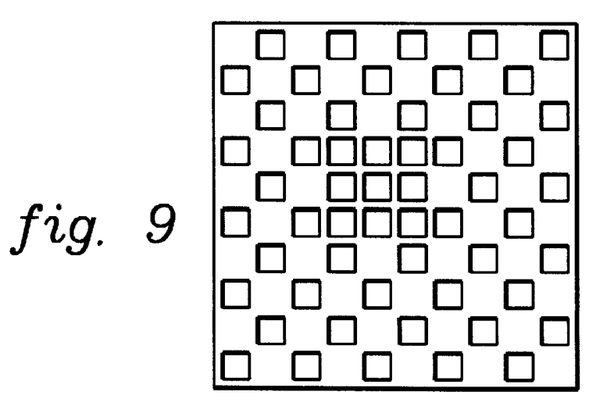
FIG. 9 is a top view of the illumination aperture of FIG. 7 having a scatter-pattern opening arrangement.
Figure 10A:
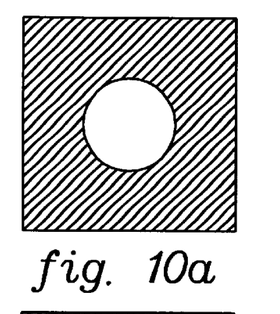
Figure 10B:
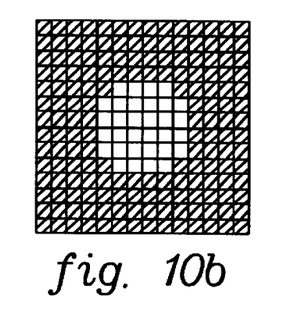
Figure 10C:
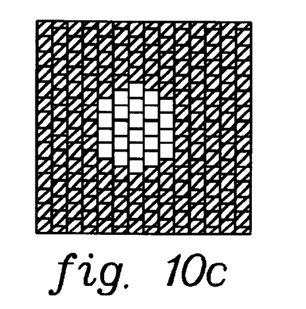
Figure 11A:
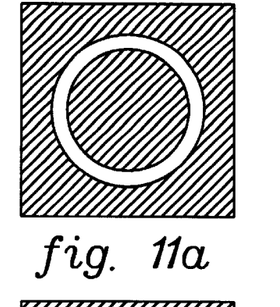
Figure 11B:
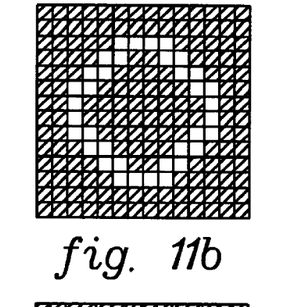
Figure 11C:
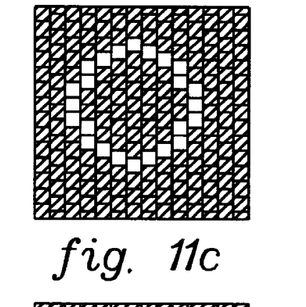
Figure 12A:
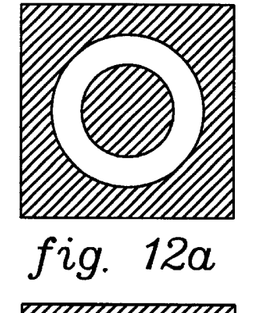
Figure 12B:
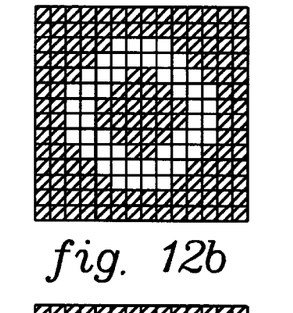
Figure 12C:
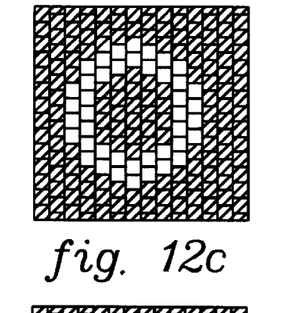
Figure 13A:
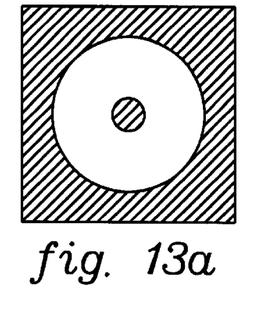
Figure 13B:
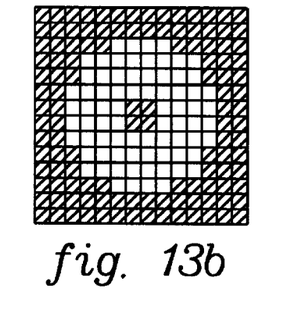
Figure 13C:
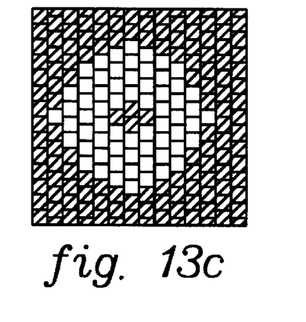
Figure 14A:
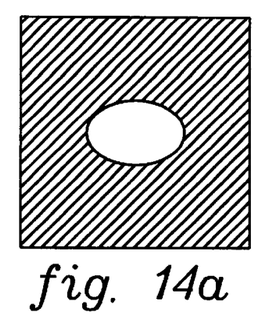
Figure 14B:
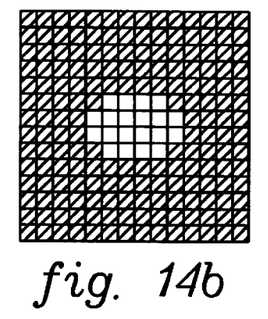
Figure 14C:
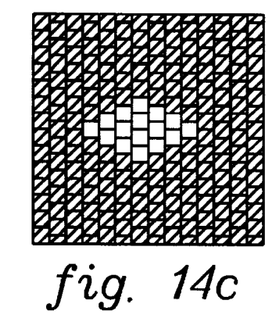
Figure 15A:
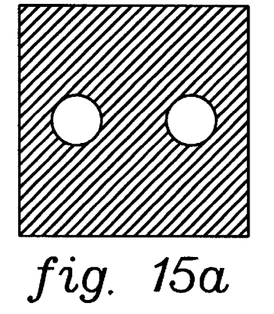
Figure 15B:
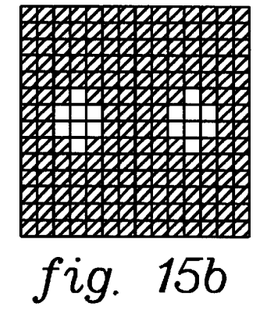
Figure 15C:
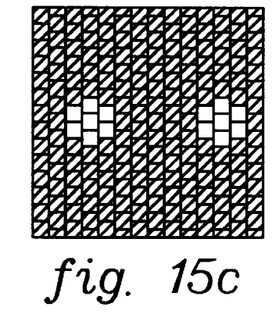
Figure 16A:
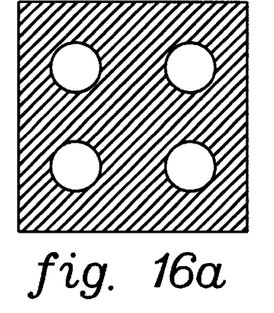
Figure 16B:
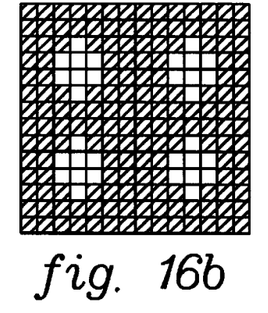
Figure 16C:
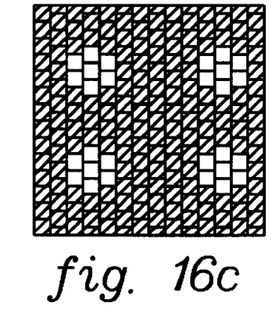
Figure 17A:
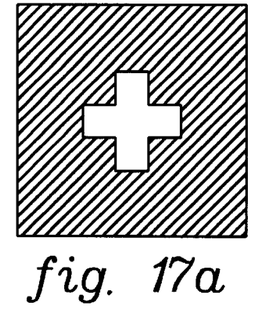
Figure 17B:
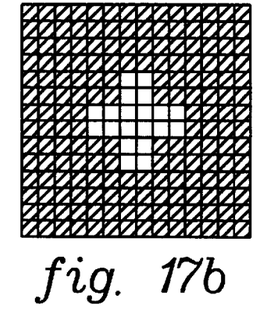

Although openings 120 of the embodiments heretofore described have been formed in arrays having five rows and five columns and fourteen rows and fourteen columns, it is to be understood that other array sizes are also possible within the principles of the present invention. For example, another embodiment having ten rows and ten columns is depicted in FIGS. 7–9. By varying the size of the array in this manner, the resolution of the illumination aperture opening may be adjusted to match the particular needs of the user. The versatility of the instant invention is further illustrated in FIGS. 8 and 9 where a multiple opening pattern and a scatter pattern are shown.

Furthermore, although the embodiments heretofore described are shown with openings aligned in a checkerboard fashion, it is to be understood that arrays having other alignments are also possible within the principles of the present invention. For example, yet another embodiment of the present invention is shown in FIGS. 10c, 11c, 12c, 13c, 14c, 15c, and 16c where openings 120 formed in main body 110 are staggered or offset from one another. By utilizing such an offset pattern, varying degrees of resolution may be attained according to needs of the user. For instance, such a staggered alignment may be better suited for forming round or curved edge aperture openings. In addition, it is to be understood that although this embodiment is shown having one particular offset alignment, arrays having other offset alignments are also possible within the principles of the present invention.

Figure 18:
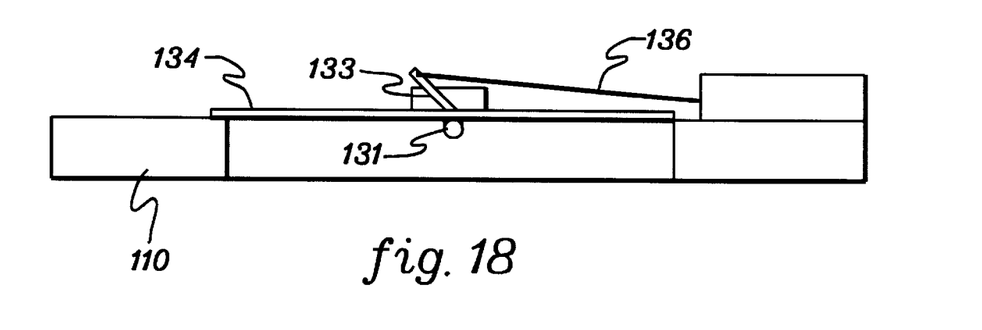
FIG. 18 is a side view of a third illumination aperture embodiment in accordance with the present invention showing a shutter in a closed position.
Figure 19:
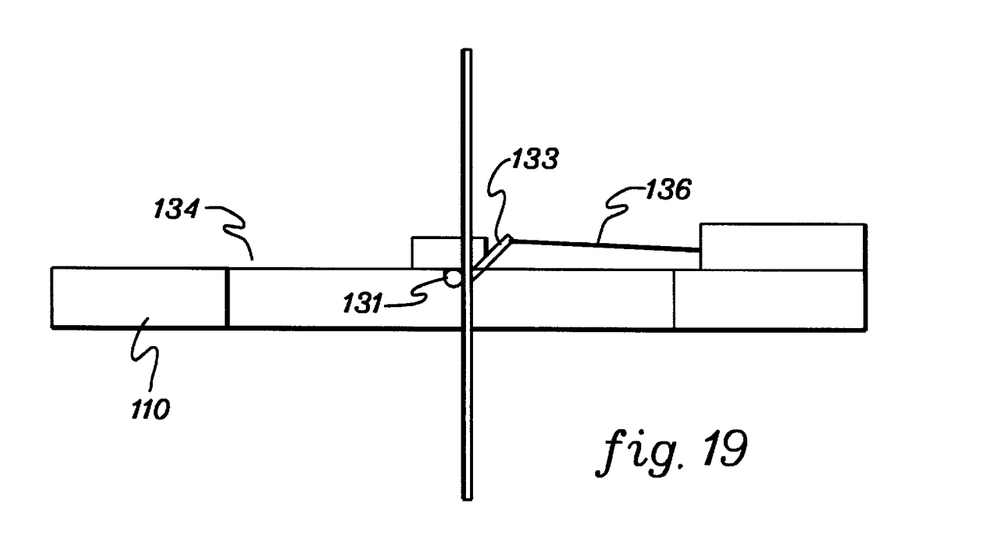
FIG. 19 is a side view of the embodiment of FIG. 18 showing a shutter in an open position.

Although shutters 134 of the embodiment of FIGS. 4–6 are shown positioned to pivot about edges defining openings 120, it is to be understood that other pivot locations are also possible within the principles of the present invention. For instance, FIGS. 18–19 illustrate yet another embodiment of the present invention with shutters 134 fixed to hinge shafts 131 extending across opening 120 from an edge defining opening 120 to another edge and spaced apart from the remaining openings. In this embodiment, as shown in FIG. 19, as shutter 134 is opened, a first side of shutter 134 extends below main body 110 and a second side projects above main body 110.

Although shutters 134 of the present invention have heretofore been shown as being pivotally connected to main body 110 to open and close openings 120. It is to be understood that other types of shutters are also possible within the principles of the present invention. For instance, in the embodiment of FIG. 7, the depicted shutters may be liquid crystal displays which are made opaque or clear at different points in the display by applying a potential at that region, which changes the anisotropic effective dielectric constant at that region.

The pattern of open apertures is best determined by the mask pattern being printed, and in many cases a compromise aperture is used if the mask has a wide range of critical mask patterns. The aperture pattern is determined based on simulation of the mask pattern being printed, based on experiment, or based on a combination of experiment and simulation.

The pattern of open apertures can be adjusted during scanning to provide different illumination to different regions of an exposure field, such as different regions of an integrated circuit chip. For example, a chip having a highly nested region such as an embedded DRAM may be exposed with the quadrupole aperture shown in FIGS. 16a–16c, while another portion of that chip having isolated lines would be exposed with the circular aperture shown in FIGS. 10a–10c.

In addition, the illuminator uniformity can be improved by adjusting the programmable aperture of the present invention. For example, if there is a region of higher intensity, a shutter can be closed in that region.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for projecting an image from a mask onto a substrate, said method comprising:
    positioning an illumination aperture between an illumination source and optical elements so that light irradiated from the illumination source passes through an illumination aperture opening defined by a plurality of independently openable and closeable apertures formed in the illumination aperture before reaching the optical elements;
    selecting an initial illumination aperture opening size and shape by independently opening and closing the apertures; and
    exposing the substrate with radiation through said illumination aperture and varying which of said Plurality of apertures are open during said exposing step.

2. The method of claim 1, further comprising varying the illumination aperture opening size and shape with a single illumination aperture.

3. The method of claim 1, wherein varying the illumination aperture opening size and shape includes forming a shape comprising one of a circular shape, an oval shape, a donut shape, multiple circular shapes, or a cross-like shape.

4. The method of claim 1, further comprising:
    irradiating light from the illumination source through the opening to vary a distribution of light incident on the optical elements.

5. The method of claim 1, further comprising:
    passing the irradiated light through the optical elements and mask to project the image onto the substrate.

6. The method of claim 1, wherein the illumination aperture opening size and shape is selected according to the image to be projected.

7. The method of claim 1, further comprising varying the illumination aperture opening size and shape with a single illumination aperture as the image to be projected is varied.

8. The method of claim 1, wherein in said selecting step, selecting said illumination aperture opening size and shape based on a mask pattern to be printed.

9. The method as recited in claim 8, wherein in said selecting step, selecting said illumination aperture opening size and shape based on a simulation of said mask pattern to be printed.

10. The method as recited in claim 8, wherein in said selecting step, selecting said illumination aperture opening size and shape based on experiment with said mask pattern to be printed.

11. The method of claim 1, wherein said exposing comprises scanning radiation across the substrate through the illumination aperture.

12. The method of claim 11, wherein said varying comprises varying which of said plurality of apertures are open in order to provide different illumination radiation to different regions of the substrate during said scanning.

13. The method of claim 12, wherein said substrate comprises an integrated circuit chip having a first region and a second region, and wherein said varying comprises varying which of said plurality of apertures are open during said scanning in order to provide different illumination radiation to said first region compared with said second region.

14. The method of claim 13, wherein said first region comprises a nested region and said second region comprises an isolated lines region.

15. The method of claim 1, wherein said varying which of said plurality of apertures are open during said exposing step comprises dynamically varying at least one of the illumination aperture opening size and shape during said exposing step.

* * * * *

UNITED STATES PATENT AND TRADEMARK OFFICE
CERTIFICATE OF CORRECTION

PATENT NO. : 6,268,908 B1
DATED : July 31, 2001
INVENTOR(S) : Bula et al.

Page 1 of 1

It is certified that error appears in the above-identified patent and that said Letters Patent is hereby corrected as shown below:

<u>Column 3,</u>
Line 45, delete "b low" and insert -- below --.

Signed and Sealed this

Twelfth Day of March, 2002

Attest:

JAMES E. ROGAN
Attesting Officer    *Director of the United States Patent and Trademark Office*